US012713847B2

(12) United States Patent
Nagatomi et al.

(10) Patent No.: US 12,713,847 B2
(45) Date of Patent: Aug. 18, 2026

(54) METHOD OF MANUFACTURING SEMICONDUCTOR DEVICE, METHOD OF PROCESSING SUBSTRATE, SUBSTRATE PROCESSING APPARATUS, AND RECORDING MEDIUM

(71) Applicant: KOKUSAI ELECTRIC CORPORATION, Tokyo (JP)

(72) Inventors: Yoshimasa Nagatomi, Toyama (JP); Hirohisa Yamazaki, Toyama (JP); Kenichi Suzaki, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 929 days.

(21) Appl. No.: 17/948,867

(22) Filed: Sep. 20, 2022

(65) Prior Publication Data

US 2023/0098746 A1 Mar. 30, 2023

(30) Foreign Application Priority Data

Sep. 24, 2021 (JP) ................................. 2021-155832

(51) Int. Cl.
*H01L 21/02* (2006.01)
*H10P 14/60* (2026.01)
(Continued)

(52) U.S. Cl.
CPC ...... *H10P 14/6339* (2026.01); *H10P 14/6314* (2026.01); *H10P 14/668* (2026.01); *H10P 14/6938* (2026.01); *H10P 72/0402* (2026.01)

(58) Field of Classification Search
CPC .......... C23C 28/023; C23C 18/54; C08J 7/14; C25D 5/50
See application file for complete search history.

(56) References Cited

U.S. PATENT DOCUMENTS

2008/0132084 A1 6/2008 Miya et al.
2013/0244445 A1 9/2013 Park et al.
(Continued)

FOREIGN PATENT DOCUMENTS

JP 2008-124184 A 5/2008
KR 10-2013-0105238 A 9/2013

OTHER PUBLICATIONS

Japanese Office Action issued on May 2, 2023 for Japanese Patent Application No. 2021-155832.
(Continued)

*Primary Examiner* — Nathan T Leong
(74) *Attorney, Agent, or Firm* — Volpe Koenig

(57) ABSTRACT

There is provided a technique that includes forming a film containing a first element and oxygen on a substrate by performing a cycle a predetermined number of times, the cycle including: (a) supplying a modifying agent to the substrate to form, on the substrate, an adsorption layer containing the modifying agent physically adsorbed on a surface of the substrate; (b) supplying a precursor containing the first element to the substrate and causing the precursor to react with the surface of the substrate to form a first layer containing the first element on the substrate; and (c) supplying an oxidizing agent to the substrate and causing the oxidizing agent to react with the first layer to modify the first layer into a second layer containing the first element and oxygen.

19 Claims, 11 Drawing Sheets

(51) Int. Cl.
*H10P 14/692* (2026.01)
*H10P 72/00* (2026.01)

(56) References Cited

U.S. PATENT DOCUMENTS

| | | | | |
|---|---|---|---|---|
| 2014/0295667 | A1 | 10/2014 | Kaga et al. | |
| 2017/0040172 | A1 | 2/2017 | Moon et al. | |
| 2017/0162386 | A1 | 6/2017 | Hashimoto et al. | |
| 2017/0350012 | A1* | 12/2017 | Moon | C23C 16/405 |
| 2018/0342391 | A1 | 11/2018 | Park et al. | |

OTHER PUBLICATIONS

Singapore Search Report issued on Jul. 17, 2025 for Singapore Patent Application No. 10202251079K.
Singapore Written Opinion issued on Jul. 17, 2025 for Singapore Patent Application No. 10202251079K.
Extended European Search Report issued on Jan. 31, 2023 for European Patent Application No. 22196915.7.

* cited by examiner

A
A2
Modifying agent
Precursor
Oxidizing agent
Inert gas

C

C2

Modifying agent

Precursor

Oxidizing agent

Inert gas

B
B2
Modifying agent
Precursor
Oxidizing agent
Inert gas

Example 2
(with step A)

Comparative Example 2
(without step A)

METHOD OF MANUFACTURING SEMICONDUCTOR DEVICE, METHOD OF PROCESSING SUBSTRATE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2021-155832, filed on Sep. 24, 2021, the entire contents of which are incorporated herein by reference.

TECHNICAL FIELD

The present disclosure relates to a method of manufacturing a semiconductor device, a method of processing a substrate, a substrate processing apparatus, and a recording medium.

BACKGROUND

In the related art, as a process of manufacturing a semiconductor device, a process of forming a film on a substrate may be carried out.

SUMMARY

Some embodiments of the present disclosure provide a technique capable of improving a quality of a film formed on a substrate.

According to some embodiments of the present disclosure, there is provided a technique that includes: forming a film containing a first element and oxygen on a substrate by performing a cycle a predetermined number of times, the cycle including: (a) supplying a modifying agent to the substrate to form, on the substrate, an adsorption layer containing the modifying agent physically adsorbed on a surface of the substrate; (b) supplying a precursor containing the first element to the substrate and causing the precursor to react with the surface of the substrate to form a first layer containing the first element on the substrate; and (c) supplying an oxidizing agent to the substrate and causing the oxidizing agent to react with the first layer to modify the first layer into a second layer containing the first element and oxygen, wherein adsorption of by-products, which are generated during the formation of the first layer, on at least one selected from the group of the first layer and the surface of the substrate is suppressed by the adsorption layer.

BRIEF DESCRIPTION OF DRAWINGS

The accompanying drawings, which are incorporated in and constitute a part of the specification, illustrate embodiments of the present disclosure.

FIG. 2 is a schematic configuration view of the vertical process furnace of the substrate processing apparatus suitably used in the embodiments of the present disclosure, in which a portion of the process furnace is shown in a cross section taken along a line A-A in FIG. 1.

FIG. 3 is a schematic configuration diagram of a controller of the substrate processing apparatus suitably used in the embodiments of the present disclosure, in which a control system of the controller is shown in a block diagram.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

Embodiments of the Present Disclosure

Embodiments of the present disclosure will now be described mainly with reference to FIGS. 1 to 4. The drawings used in the following description are schematic, and dimensional relationships, ratios, and the like of various elements shown in figures may not match the actual ones. Further, dimensional relationship, ratios, and the like of various elements among plural figures may not match each other.

(1) Configuration of Substrate Processing Apparatus

Figure 1:
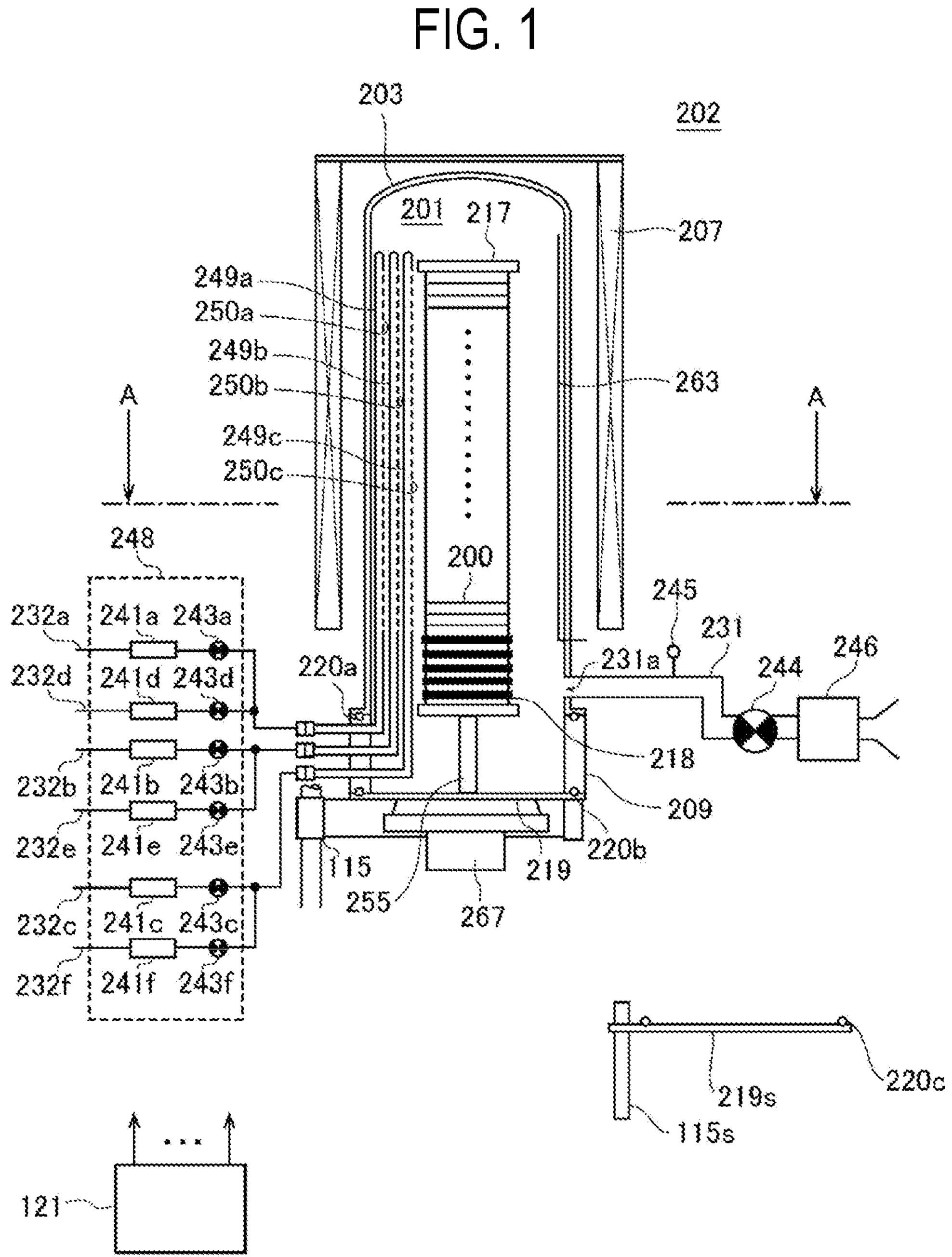
FIG. 1 is a schematic configuration view of a vertical process furnace of a substrate processing apparatus suitably used in embodiments of the present disclosure, in which a portion of a process furnace is shown in a vertical cross section.

As shown in FIG. 1, a process furnace 202 includes a heater 207 as a temperature regulator (a heating part). The heater 207 is formed in a cylindrical shape and is supported by a holding plate to be vertically installed. The heater 207 also functions as an activator (an exciter) configured to thermally activate (excite) a gas.

A reaction tube 203 is disposed inside the heater 207 to be concentric with the heater 207. The reaction tube 203 is made of, for example, heat resistant material such as quartz ($SiO_2$) or silicon carbide (SiC), and is formed in a cylindrical shape with its upper end closed and its lower end opened. A manifold 209 is disposed to be concentric with the reaction tube 203 under the reaction tube 203. The manifold 209 is made of, for example, metal material such as stainless steel (SUS), and is formed in a cylindrical shape with both of its upper and lower ends opened. The upper end portion of the manifold 209 engages with the lower end portion of the reaction tube 203 to support the reaction tube 203. An O-ring 220*a* serving as a seal is provided between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to be capable of accommodating a plurality of wafers 200 as substrates. The wafers 200 are processed in the process chamber 201.

Nozzles 249*a* to 249*c* as first to third suppliers are provided in the process chamber 201 to penetrate a sidewall of the manifold 209. The nozzles 249*a* to 249*c* are also referred to as first to third nozzles, respectively. The nozzles 249*a* to 249*c* are made of, for example, heat resistant material such as quartz or SiC. Gas supply pipes 232*a* to 232*c* are connected to the nozzles 249*a* to 249*c*, respectively. The nozzles 249*a* to 249*c* are different nozzles, and each of the nozzles 249*a* and 249*c* is provided adjacent to the nozzle 249*b*.

Mass flow controllers (MFCs) 241*a* to 241*c*, which are flow rate controllers (flow rate control parts), and valves 243*a* to 243*c*, which are opening/closing valves, are provided at the gas supply pipes 232*a* to 232*c*, respectively, sequentially from the upstream side of a gas flow. Gas supply pipes 232*d* and 232*f* are connected to the gas supply pipes 232*a* to 232*c* at the downstream side of the valves 243*a* to 243*c*, respectively. MFCs 241*d* to 241*f* and valves 243*d* to 243*f* are provided at the gas supply pipes 232*d* to 232*f*, respectively, sequentially from the upstream side of a gas flow. The gas supply pipes 232*a* to 232*f* are made of, for example, metal material such as SUS.

Figure 2:
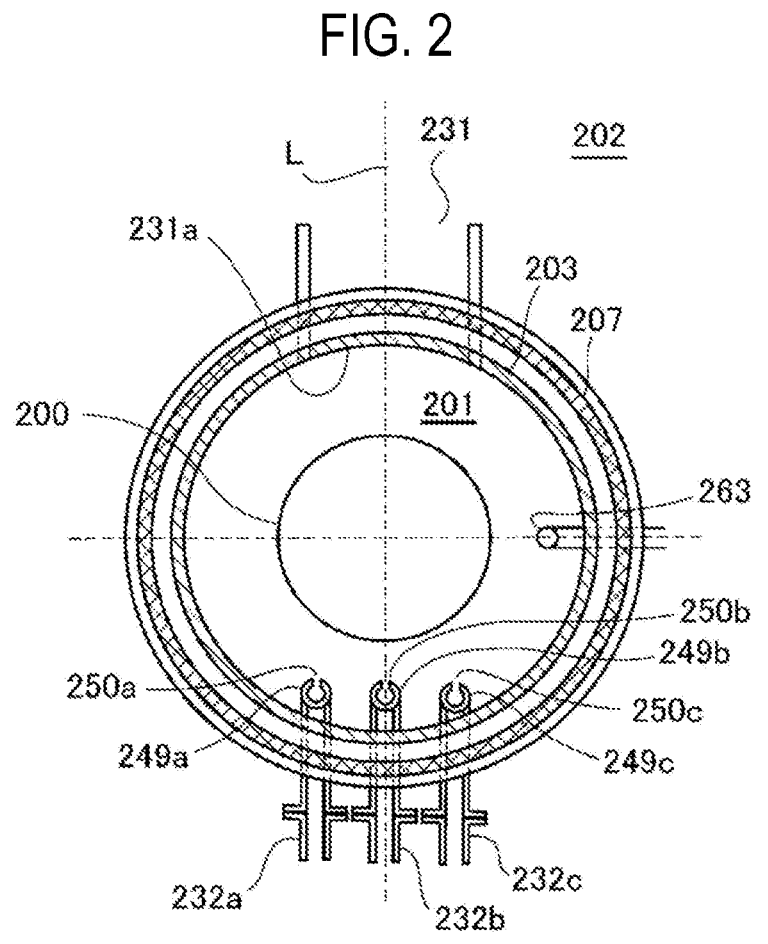

As shown in FIG. 2, each of the nozzles 249*a* to 249*c* is provided in an annular space (in a plane view) between an inner wall of the reaction tube 203 and the wafers 200 to extend upward from a lower portion to an upper portion of the inner wall of the reaction tube 203, that is, along an arrangement direction of the wafers 200. Specifically, each of the nozzles 249*a* to 249*c* is provided at a region horizontally surrounding a wafer arrangement region in which the wafers 200 are arranged at a lateral side of the wafer arrangement region, along the wafer arrangement region. In the plane view, the nozzle 249*b* is disposed to face an exhaust port 231*a* to be described later on a straight line with a center of the wafer 200 loaded into the process chamber 201 being interposed between the nozzle 249*b* and the exhaust port 23*a*. The nozzles 249*a* and 249*c* are arranged to sandwich a straight line L passing through the nozzle 249*b* and a center of the exhaust port 231*a* from both sides along the inner wall of the reaction tube 203 (outer peripheral portions of the wafers 200). The straight line L is also a straight line passing through the nozzle 249*b* and the centers of the wafers 200. That is, it may be said that the nozzle 249*c* is provided at an opposite side of the nozzle 249*a* with the straight line L interposed therebetween. The nozzles 249*a* and 249*c* are arranged in line symmetry with the straight line L as an axis of symmetry. Gas supply holes 250*a* to 250*c* configured to supply a gas are formed on the side surfaces of the nozzles 249*a* to 249*c*, respectively. Each of the gas supply holes 250*a* to 250*c* is opened to oppose (face) the exhaust port 231*a* in the plane view, and is configured to be capable of supplying a gas toward the wafers 200. A plurality of gas supply holes 250*a* to 250*c* are formed from the lower portion to the upper portion of the reaction tube 203.

A modifying agent (modifying gas) is supplied from the gas supply pipe 232*a* into the process chamber 201 via the MFC 241*a*, the valve 243*a*, and the nozzle 249*a*.

A precursor (precursor gas) is supplied from the gas supply pipe 232*b* into the process chamber 201 via the MFC 241*b*, the valve 243*b*, and the nozzle 249*b*. The precursor is used as a film-forming agent.

An oxidizing agent (oxidizing gas) is supplied from the gas supply pipe 232*c* into the process chamber 201 via the MFC 241*c*, the valve 243*c*, and the nozzle 249*c*. The oxidizing agent is used as a film-forming agent.

An inert gas is supplied from the gas supply pipes 232*d* to 232*f* into the process chamber 201 via the MFCs 241*d* to 241*f*, the valves 243*d* to 243*f*, the gas supply pipes 232*a* to 232*c*, and the nozzles 249*a* to 249*c*, respectively. The inert gas acts as a purge gas, a carrier gas, a dilution gas, or the like.

A modifying agent supply system (modifying gas supply system) mainly includes the gas supply pipe 232*a*, the MFC 241*a*, and the valve 243*a*. A precursor supply system (precursor gas supply system) mainly includes the gas supply pipe 232*b*, the MFC 241*b*, and the valve 243*b*. An oxidizing agent supply system (oxidizing gas supply system) mainly includes the gas supply pipe 232*c*, the MFC 241*c*, and the valve 243*c*. An inert gas supply system mainly includes the gas supply pipes 232*d* to 232*f*, the MFCs 241*d* to 241*f*, and the valves 243*d* to 243*f*.

One or all of the above-described various supply systems may be configured as an integrated supply system 248 where the valves 243*a* to 243*f*, the MFCs 241*a* to 241*f*, and so on are integrated. The integrated supply system 248 is connected to each of the gas supply pipes 232*a* to 232*f*, and is configured such that operations of supplying various materials (various gases) into the gas supply pipes 232*a* to 232*f* (that is, opening/closing operations of the valves 243*a* to 243*f*, flow rate regulating operations by the MFCs 241*a* to 241*f*, and the like) are controlled by a controller 121 which will be described later. The integrated supply system 248 is configured as an integral type or detachable-type integrated unit, and may be attached to and detached from the gas supply pipes 232*a* to 232*f* and the like on an integrated unit basis, such that maintenance, replacement, extension, and the like of the integrated supply system 248 may be performed on an integrated unit basis.

The exhaust port 231*a* configured to exhaust an internal atmosphere of the process chamber 201 is provided below the sidewall of the reaction tube 203. As shown in FIG. 2, in the plane view, the exhaust port 231*a* is provided at a position opposing (facing) the nozzles 249*a* to 249*c* (the gas supply holes 250*a* to 250*c*) with the wafers 200 interposed therebetween. The exhaust port 231*a* may be provided from a lower portion to an upper portion of the sidewall of the reaction tube 203, that is, along the wafer arrangement region. An exhaust pipe 231 is connected to the exhaust port 231*a*. A vacuum exhauster, for example, a vacuum pump 246, is connected to the exhaust pipe 231 via a pressure sensor 245, which is a pressure detector (pressure detection part) configured to detect an internal pressure of the process chamber 201, and an auto pressure controller (APC) valve 244, which is a pressure regulator (pressure regulation part). The APC valve 244 is configured to be capable of performing or stopping a vacuum exhausting operation in the process chamber 201 by opening/closing the valve while the vacuum pump 246 is actuated, and is also configured to be capable of adjusting the internal pressure of the process chamber 201 by adjusting an opening state of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening lid configured to be capable of hermetically sealing a lower end opening of the manifold 209, is provided under the manifold 209. The seal cap 219 is made of, for example, metal material such as SUS, and is formed in a disc shape. An P-ring 220*b*, which is a seal making contact with the lower end of the manifold 209, is provided at an upper surface of the seal cap 219. A rotator 267 configured to rotate a boat 217, which will be described later, is installed under the seal cap 219. A rotary shaft 255 of the rotator 267 is connected to the boat 217 through the seal cap 219. The rotator 267 is configured to rotate the wafers 200 by rotating the boat 217. The seal cap 219 is configured to be vertically moved up or down by a boat elevator 115 which is an elevator installed outside the reaction tube 203. The boat elevator 115 is configured as a transporter (transport mechanism) which loads/unloads (transports) the wafers 200 into/out of the process chamber 201 by moving the seal cap 219 up or down.

A rotator 267 configured to rotate a boat 217, which will be described later, is installed under the seal cap 219. A rotary shaft 255 of the rotator 267 is connected to the boat 217 through the seal cap 219. The rotator 267 is configured to rotate the wafers 200 by rotating the boat 217. The seal cap 219 is configured to be vertically moved up or down by a boat elevator 115 which is an elevator installed outside the reaction tube 203. The boat elevator 115 is configured as a transporter (transport mechanism) which loads/unloads (transports) the wafers 200 into/out of the process chamber 201 by moving the seal cap 219 up or down.

A shutter 219*s*, which serves as a furnace opening lid configured to be capable of hermetically sealing a lower end opening of the manifold 209 in a state where the seal cap 219 is lowered and the boat 217 is unloaded from the process chamber 201, is provided under the manifold 209. The shutter 219*s* is made of, for example, metal material such as SUS, and is formed in a disc shape. An O-ring 220*c*, which is a seal making contact with the lower end of the manifold 209, is provided at an upper surface of the shutter 219*s*. The opening/closing operation (such as elevation operation, rotation operation, or the like) of the shutter 219*s* is controlled by a shutter opening/closing mechanism 115*s*.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is regulated such that a temperature distribution in the process chamber 201 becomes a desired temperature distribution. The temperature sensor 263 is provided along the inner wall of the reaction tube 203.

Figure 3:
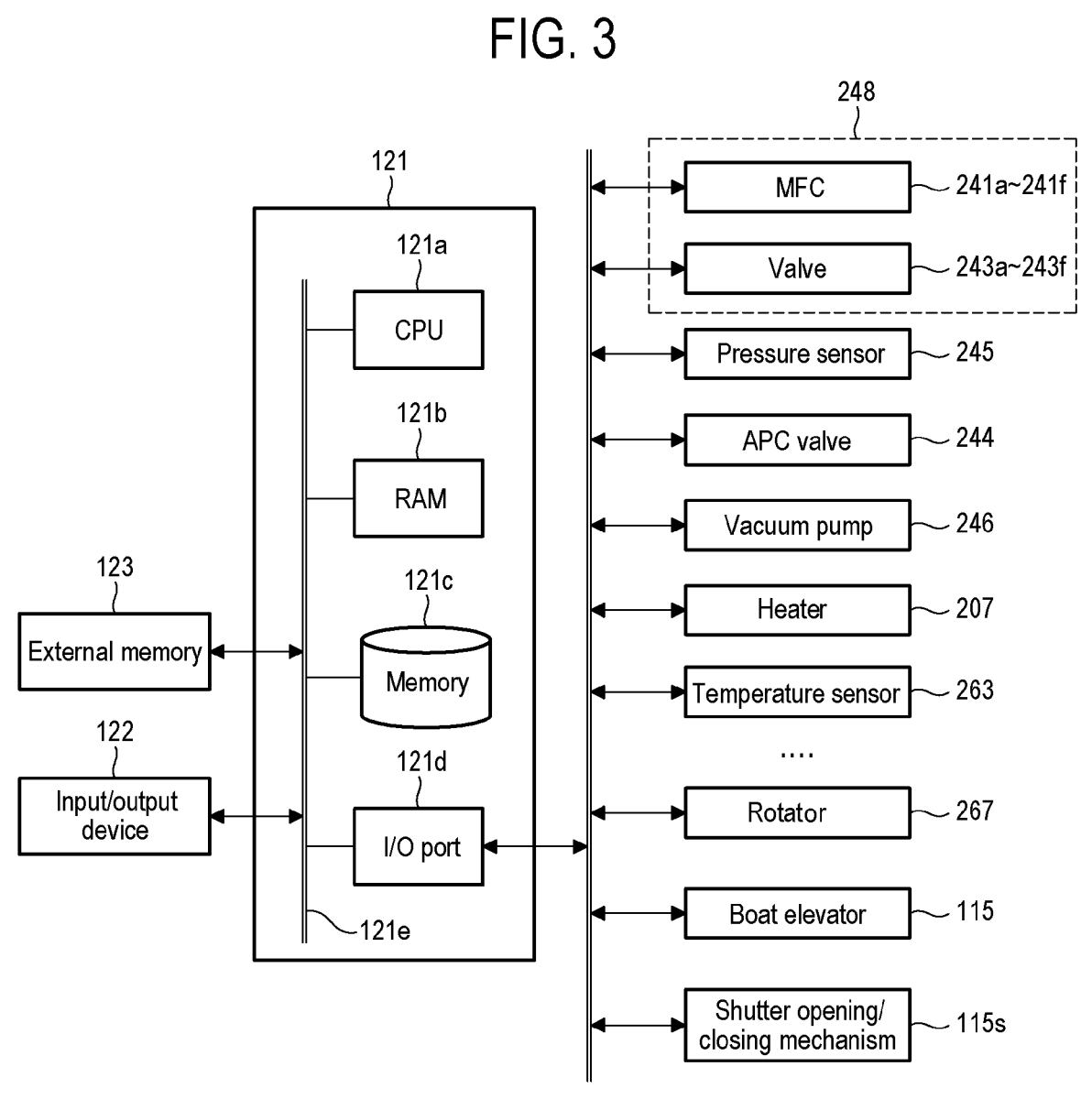

As shown in FIG. 3, a controller 121, which is a control part (control means or unit), is configured as a computer including a central processing unit (CPU) 121*a*, a random access memory (RAM) 121*b*, a memory 121*c*, and an I/O port 121*d*. The RAM 121*b*, the memory 121*c*, and the I/O port 121*d* are configured to be capable of exchanging data with the CPU 121*a* via an internal bus 121*e*. An input/output device 122 formed of, e.g., a touch panel or the like, is connected to the controller 121. Further, an external memory 123 may be connected to the controller 121.

The memory 121*c* is configured by, for example, a flash memory, a hard disk drive (HDD), a solid state drive (SSD), or the like. A control program that controls operations of a substrate processing apparatus, a process recipe in which sequences and conditions of substrate processing to be described later are written, etc. are readably stored in the memory 121*c*. The process recipe functions as a program that causes, by the controller 121, the substrate processing apparatus to execute each sequence in the substrate processing, which will be described later, to obtain an expected result. Hereinafter, the process recipe and the control program may be generally and simply referred to as a "program." Furthermore, the process recipe may be simply referred to as a "recipe." When the term "program" is used herein, it may indicate a case of including the recipe, a case of including the control program, or a case of including both the recipe and the control program. The RAM 121*b* is configured as a memory area (work area) in which programs or data read by the CPU 121*a* are temporarily stored.

The I/O port 121*d* is connected to the MFCs 241*a* to 241*f*, the valves 243*a* to 243*f*, the pressure sensor 245, the APC valve 244, the vacuum pump 246, the temperature sensor 263, the heater 207, the rotator 267, the boat elevator 115, the shutter opening/closing mechanism 115*s*, and so on.

The CPU 121*a* is configured to read and execute the control program from the memory 121*c*. The CPU 121*a* is also configured to be capable of reading the recipe from the memory 121*c* according to an input of an operation command from the input/output device 122. In addition, the CPU 121*a* is configured to be capable of controlling the flow rate regulating operation of various kinds of materials (gases) by the MFCs 241*a* to 241*f*, the opening/closing operation of the valves 243*a* to 243*f*, the opening/closing operation of the APC valve 244, the pressure regulating operation performed by the APC valve 244 based on the pressure sensor 245, the actuating and stopping operation of the vacuum pump 246, the temperature regulating operation performed by the heater 207 based on the temperature sensor 263, the operation of rotating the boat 217 with the rotator 267 and adjusting the rotation speed of the boat 217, the operation of moving the boat 217 up or down by the boat elevator 115, the opening/closing operation of the shutter 219*s* by the shutter opening/closing mechanism 115*s*, and so on, according to contents of the read recipe.

The controller 121 may be configured by installing, on the computer, the aforementioned program stored in the external memory 123. Examples of the external memory 123 may include a magnetic disk such as a HDD, an optical disc such as a CD, a magneto-optical disc such as a MO, a semiconductor memory such as a USB memory or a SSD, and the like. The memory 121*c* or the external memory 123 is configured as a computer-readable recording medium. Hereinafter, the memory 121*c* and the external memory 123 may be generally and simply referred to as a "recording medium." When the term "recording medium" is used herein, it may indicate a case of including the memory 121*c*, a case of including the external memory 123, or a case of including both the memory 121*c* and the external memory 123. Furthermore, the program may be provided to the computer by using communication means or unit such as the Internet or a dedicated line, instead of using the external memory 123.

(2) Substrate Processing Process

As a process of manufacturing a semiconductor device by using the above-described substrate processing apparatus, a processing sequence example of forming a film on a wafer 200 as a substrate, will be described mainly with reference to FIG. 4. In the following description, operations of the respective components constituting the substrate processing apparatus are controlled by the controller 121.

Figure 4:
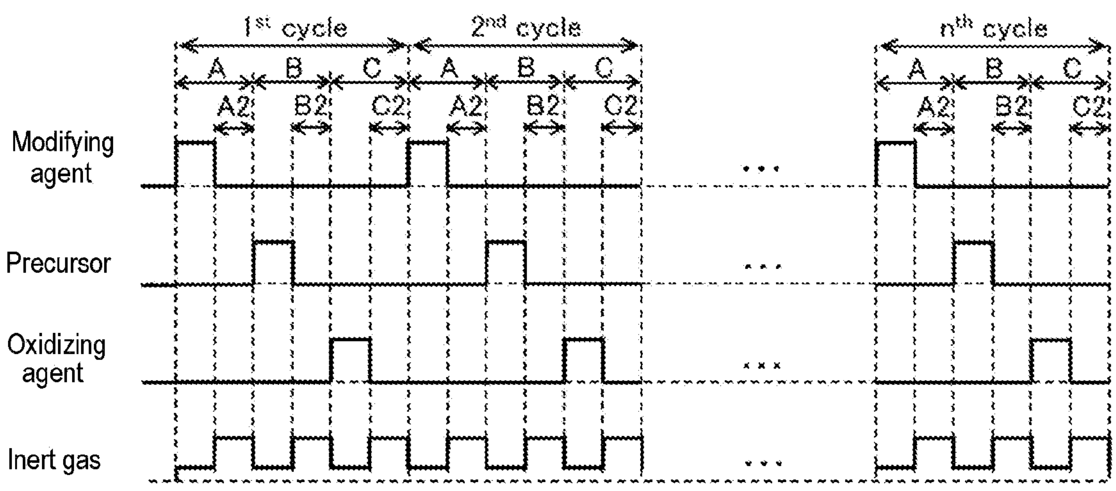
FIG. 4 is a diagram showing a gas supply sequence in embodiments of the present disclosure.

A processing sequence shown in FIG. 4 includes:

performing a cycle a predetermined number of times (n times, where n is an integer of 1 or more), the cycle including:

step A of supplying a modifying agent to a wafer 200 to form an adsorption layer containing the modifying agent on the wafer 200, is the adsorption layer being physically adsorbed on a surface of the wafer 200;

step B of supplying a precursor containing a first element to the wafer 200 and causing the precursor to react with the surface of the wafer 200 to form a first layer containing the first element on the wafer 200; and step C of supplying an oxidizing agent to the wafer 200 and causing the oxidizing agent to react with the first layer to modify the first layer into a second layer containing the first element and oxygen.

In the processing sequence shown in FIG. 4, adsorption of by-products, which are generated during the formation of the first layer, on at least one selected from the group of the first layer and the surface of the wafer 200 is suppressed by the adsorption layer.

In the present disclosure, for the sake of convenience, the above-described processing sequence may be denoted as follows. The same denotation may be used in modifications and other embodiments to be described later.

$$(\text{Modifying agent}\rightarrow\text{Precursor}\rightarrow\text{Oxidizing agent})\times n$$

When the term "wafer" is used in the present disclosure, it may refer to "a wafer itself" or "a stacked body of a wafer and certain layers or films formed on a surface of the wafer." When the phrase "a surface of a wafer" is used in the present disclosure, it may refer to "a surface of a wafer itself" or "a surface of a certain layer or the like formed on a wafer." When the expression "a certain layer is formed on a wafer" is used in the present disclosure, it may mean that "a certain layer is formed directly on a surface of a wafer itself" or that "a certain layer is formed on a layer or the like formed on a wafer." When the term "substrate" is used in the present disclosure, it may be synonymous with the term "wafer."

The term "agent" used in the present disclosure includes at least one selected from the group of a gaseous substance and a liquefied substance. The liquefied substance includes a misty substance. That is, each of a modifying agent and a film-forming agent (precursor or oxidizing agent) may include a gaseous substance, a liquefied substance such as a misty substance, or both of them.

(Wafer Charging and Boat Loading)

After the boat 217 is charged with a plurality of wafers 200 (wafer charging), the shutter 219*s* is moved by the shutter opening/closing mechanism 115*s* and the lower end opening of the manifold 209 is opened (shutter open). Thereafter, as shown in FIG. 1, the boat 217 charged with the plurality of wafers 200 is lifted up by the boat elevator 115 to be loaded into the process chamber 201 (boat loading). In this state, the seal cap 219 seals the lower end of the manifold 209 via the O-ring 220*b*. A concave structure such as a trench or a hole is formed on the surface of the wafer 200. An aspect ratio of the concave structure, that is, a ratio calculated by (a depth of an internal space of the concave structure)/(a width of the internal space of the concave structure), is, for example, 10 or more.

(Pressure Regulation and Temperature Regulation)

After the boat loading is completed, the interior of the process chamber 201, that is, a space where the wafers 200 are placed, is vacuum-exhausted (decompression-exhausted) by the vacuum pump 246 to reach a desired pressure (state of vacuum). At this time, the internal pressure of the process chamber 201 is measured by the pressure sensor 245, and the APC valve 244 is feedback-controlled based on the measured pressure information. Further, the wafers 200 in the process chamber 201 are heated by the heater 207 to reach a desired processing temperature. At this time, the state of supplying electric power to the heater 207 is feedback-controlled based on the temperature information detected by the temperature sensor 263 such that a temperature distribution of the interior of the process chamber 201 becomes a desired temperature distribution. Further, rotation of the wafers 200 by the rotator 267 is started. The exhaust of the interior of the process chamber 201 and the heating and rotation of the wafers 200 are continuously performed at least until the processing on the wafers 200 is completed.

(Film Formation)

After that, the following steps A to C are sequentially executed.

[Step A]

In this step, the modifying agent is supplied to the wafer 200 in the process chamber 201.

Specifically, the valve 243*a* is opened to allow the modifying agent to flow through the gas supply pipe 232*a*. A flow rate of the modifying agent is regulated by the MFC 241*a*, and the modifying agent is supplied into the process chamber 201 via the nozzle 249*a* and is exhausted via the exhaust port 231*a*. In this operation, the modifying agent is supplied to the wafer 200 (modifying agent supply). The modifying agent may be supplied in a state where it is diluted with a dilution gas such as an inert gas. Further, at this time, the valves 243*d* to 243*f* may be opened to allow an inert gas to be supplied into the process chamber 201 via the nozzles 249*a* to 249*c*, respectively.

By supplying the modifying agent to the wafer 200 under conditions to be described later, the modifying agent is physically adsorbed on the surface of the wafer 200, whereby it is possible to form, on the wafer 200, an adsorption layer containing the modifying agent, which is physically adsorbed on the surface of the wafer 200. As a result of the formation of the adsorption layer, a portion of adsorption sites existing on the surface of the wafer 200 are covered by the adsorption layer, and another portion of adsorption sites are exposed without being covered by the adsorption layer. Here, the adsorption sites existing on the surface of the wafer 200 contain, for example, a hydroxy group (OH group) that terminates the surface of the wafer 200. Further, since the modifying agent contains an organic compound as described later, at least a portion of the surface of the adsorption layer may be in a state of being terminated by a hydrocarbon group or the like.

A thickness of the adsorption layer may be less than one molecular layer. That is, the adsorption layer may contain the modifying agent adsorbed to discontinuously cover the surface of the wafer 200. As a result, it is possible to ensure that a portion of the adsorption sites (OH groups) existing on the surface of the wafer 200 are exposed. However, at this stage, the modifying agent is physically adsorbed on the surface of the wafer 200 so that the thickness of the adsorption layer is one molecular layer or more (that is, the surface of the wafer 200 is covered with a continuous layer), the adsorption layer with a thickness of less than one molecular layer may be formed by removing a portion of the modifying agent contained in the adsorption layer from the surface of the wafer 200 in step A2 to be described later.

Further, in this step, the adsorption layer is formed on at least a surface near an opening (particularly a side wall near the opening) among inner surfaces of the concave structure formed on the surface of the wafer 200. Further, as will be described later, in this step, an adsorption layer may also be formed on a bottom surface and a side wall of the inner surfaces of the concave structure.

After forming the adsorption layer on the wafer 200, the valve 243*a* is closed to stop the supply of the modifying agent into the process chamber 201.

After the supply of the modifying agent to the wafer 200 is completed (after being stopped), as shown in FIG. 4, step A2 of removing a gas or the like remaining in the process chamber 201 from the process chamber 201 by exhausting the interior of the process chamber 201 in a state where the supply of the modifying agent into the process chamber 201 is stopped may be performed. By continuing step A2, a portion of the modifying agent contained in the adsorption layer may be removed (desorbed) from the surface of the wafer 200, such that it is possible to regulate a density (thickness) of the adsorption layer formed on the wafer 200 to a desired density (thickness). That is, in step A2, the exhaust of the interior of the process chamber 201 may be continued until the thickness of the adsorption layer reaches the desired density. As a result, it is possible to regulate a rate of formation of a film on the wafer 200 to a relatively large desired value by optimizing a thickness of a first layer formed per cycle. In step A2, exhaust conditions, that is, an exhaust time, an exhaust speed, and the like, in the process chamber 201 may be set such that the formation rate of the film formed on the wafer 200 becomes a desired value.

Figures 5A, 5B:
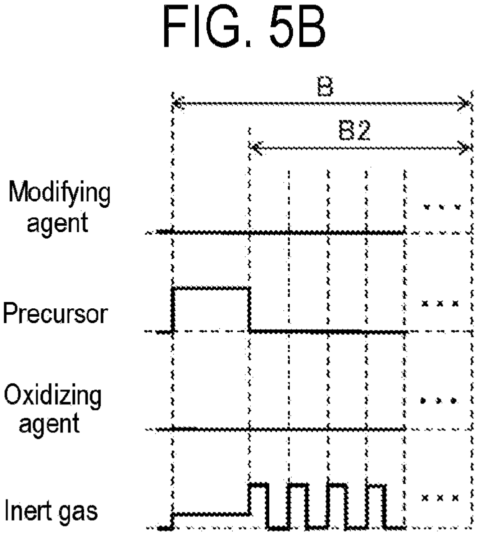
FIG. 5A is a diagram showing a modifying agent supply sequence in embodiments of the present disclosure.
FIG. 5B is a diagram showing a precursor supply sequence in embodiments of the present disclosure.

Further, as shown in FIG. 4, in step A2, the valves 243*d* to 243*f* may be opened to allow an inert gas to be supplied into the process chamber 201 via the nozzles 249*a* to 249*c*, respectively. That is, in step A2, the interior of the process chamber 201 may be exhausted while supplying the inert gas to the wafer 200. Further, in step A2, as shown in FIG. 5A, a step of exhausting the interior of the process chamber 201 while supplying the inert gas to the wafer 200 (inert gas purge step) and a step of exhausting the interior of the process chamber 201 with the supply of the inert gas stopped (vacuum purge step) may be performed. Further, in step A2, a purge cycle, which includes (non-simultaneously performs) a step of exhausting the interior of the process chamber 201 while supplying the inert gas to the wafer 200 and a step of exhausting the interior of the process chamber 201 with the supply of the inert gas stopped, may be performed one or more times.

By performing step A2 with any of the above steps, a portion of the modifying agent physically adsorbed on the surface of the wafer 200 may be removed more efficiently from the surface of the wafer 200, such that it is possible to more reliably regulate the density (thickness) of the adsorption layer formed on the 200 to be a desired density (thickness). As a result, for example, the thickness of the first layer formed per cycle may be further optimized, such that the formation of the film on the wafer 200 may be regulated to proceed at a higher rate.

Process conditions in supplying the modifying agent in step A are exemplified as follows:

- Modifying agent supply flow rate (excluding dilution gas): 0.01 to 10 g/min, more specifically 0.1 to 5 g/min;
- Dilution gas supply flow rate: 100 to 100,000 sccm, more specifically 1,000 to 50,000 sccm;
- Modifying agent supply time: 1 to 600 seconds, more specifically 10 to 300 seconds;
- Inert gas supply flow rate (for each gas supply pipe): 0 to 50,000 sccm, more specifically 5,000 to 15,000 sccm;
- Processing temperature: 200 to 500 degrees C., more specifically 200 to 350 degrees C.; and
- Processing pressure: 100 to 10,000 Pa, more specifically 100 to 1,000 Pa.

In the present disclosure, notation of a numerical range such as "100 to 100,000 sccm" means that a lower limit value and an upper limit value thereof are included in the range. Therefore, for example, "100 to 100,000 sccm" means "100 sccm or higher and 100,000 sccm or lower." The same applies to other numerical ranges. Further, a flow rate of 0 sccm means a case where supply of the pertinent material is not carried out.

Process conditions in step A2 are exemplified as follows:

- Exhaust time: 1 to 600 seconds, more specifically 10 to 300 seconds; and
- Inert gas supply flow rate (for each gas supply pipe): 0 to 100,000 sccm, more specifically 0 to 50,000 sccm.

As the modifying agent, a gas containing an organic compound may be used. As the gas containing an organic compound, a gas containing at least one selected from the group of an ether compound, a ketone compound, an amine compound, and an organic hydrazine compound may be used. As the gas containing the ether compound, a gas containing at least one selected from the group of dimethylether, diethylether, methylethylether, propylether, isopropylether, furan, tetrahydrofuran, pyran, tetrahydropyran, and the like may be used. As the gas containing the ketone compound, a gas containing at least one selected from the group of dimethylketone, diethylketone, methylethylketone, methylpropylketone, and the like may be used. As the gas containing the amine compound, a gas containing at least one selected from the group of a methylamine compound such as monomethylamine, dimethylamine, trimethylamine, or the like, an ethylamine compound such as monoethylamine, diethylamine, triethylamine, or the like, and a methylethylamine compound such as dimethylethylamine, methylthethylamine, or the like may be used. As the gas containing the organic hydrazine compound, a gas containing at least one selected from the group of methylhydrazine-based gases such as monomethylhydrazine, dimethylhydrazine, trimethylhydrazine, and the like may be used. As the modifying agent, one or more selected from the group of these gases may be used. Further, as the modifying agent, a gas that is not easily chemically adsorbed on the surface of the wafer 200 may be used. For example, a gas that does not substantially chemically react with the adsorption sites (OH groups) on the surface of the wafer 200 may be suitably used to form the adsorption layer containing the modifying agent physically adsorbed on the surface of the wafer 200.

As the inert gas, a rare gas such as a nitrogen ($N_2$) gas, an argon (Ar) gas, a helium (He) gas, a neon (Ne) gas, a xenon (Xe) gas, or the like may be used. As the inert gas, one or more selected from the group of these gases may be used. The same applies in each step to be described later.

[Step B]

After step A is completed, a precursor is supplied to the wafer 200 in the process chamber 201, that is, to the wafer 200 with the adsorption layer formed on the surface of the wafer 200.

Specifically, the valve 243*b* is opened to allow the precursor to flow through the gas supply pipe 232*b*. A flow rate of the precursor is regulated by the MFC 241*b*, and the precursor is supplied into the process chamber 201 via the nozzle 249*b* and is exhausted via the exhaust port 231*a*. In this operation, the precursor is supplied to the wafer 200 (precursor supply). The precursor may be supplied in a state where it is diluted with a dilution gas such as an inert gas. Further, at this time, the valves 243*d* to 243*f* may be opened to allow an inert gas to be supplied into the process chamber 201 via the nozzles 249*a* to 249*c*, respectively.

By supplying the precursor to the wafer 200 under conditions to be described later, it is possible to cause the precursor to react with the surface of the wafer 200. As will be described later, the precursor contains a molecule containing a first element and a ligand bonded to the first element (hereinafter, also referred to as a precursor molecule). When the precursor reaches the surface of the wafer 200, it reacts with the exposed surface of the wafer 200 which is not covered by the modified layer, that is, the adsorption sites (OH groups) exposed on the surface of the wafer 200. In the process of this reaction, the ligand is desorbed from the first element contained in the precursor, and the first element containing non-bonded species due to the desorption of the ligand is chemically adsorbed (bonded) to the surface of the wafer 200. As this reaction proceeds, a first layer containing the first element is formed on the wafer 200, that is, on the exposed surface (exposed portion) of the wafer 200 which is not covered by the adsorption layer.

Certain by-products are generated when the first layer is formed. The by-products may contain ligands desorbed from the first element by the reaction between the precursor and the adsorption sites exposed on the surface of the wafer 200. Further, for example, the by-products may contain molecules in which a portion of ligands are desorbed from molecules containing the first element and the ligands bonded to the first element. The molecules in which the portion of the ligands are desorbed from the molecules containing the first element and the ligands bonded to the first element may be generated, for example, by thermally decomposing the precursor supplied into the process chamber 201.

As will be described later, the by-products may contain organic ligands (organic substances), and the adsorption (adhesion) of the by-products on the surface of a film formed on the wafer 200 and the residual of the by-products in the film are not desirable. The adsorption of the by-products on the surface of the film and the residual of the by-products in the film are factors that increase the thickness of the film. Therefore, the amount of adsorbed by-products and residual amount of by-products becomes non-uniform in the wafer surface and in the inner surface (inner wall) of the concave structure on the wafer, which may be a factor that deteriorates a wafer in-plane film thickness uniformity of the film formed on the wafer 200 and a step coverage of the film formed in the inner surface of the concave structure. In addition, the residual of the by-products in the film may cause deterioration of a film quality due to an increase in impurities derived from the by-products in the film.

In this regard, according to the embodiments of the present disclosure, the adsorption (adhesion) of the by-products generated during the formation of the first layer on at least one selected from the group of the first layer and the surface of the wafer 200 may be suppressed by the adsorption layer formed in advance in step A. This makes it possible to suppress an uncontrolled and non-uniform increase in a film thickness of the film formed on the wafer 200 due to the adsorption of the by-products, and the residual of the by-products in the film.

It is considered that one reason why the adsorption of the by-products on the first layer and the surface of the wafer 200 may be suppressed is that the adsorption layer formed in step A may reduce an amount of exposure of the surface of the wafer 200, that is, an amount (density per unit area) of adsorption sites exposed on the surface of the wafer 200, whereby an amount (degree) of reaction between the precursor and the surface of the wafer 200 is appropriately controlled, resulting in the reduction in the amount of ligands desorbed from the first element, that is, the amount of by-products containing organic ligands.

Further, it is considered that another reason why the adsorption of the by-products on the first layer and the surface of the wafer 200 may be suppressed is that, in addition to the reduction in the amount of by-products generated during the formation of the first layer as described above, the adsorption layer formed in advance in step A acts to properly cover a portion of the surface of the wafer 200 such that the by-products do not adhere (are not physically adsorbed) on the portion of the surface of the wafer 200 or acts to suppress the by-products generated during the formation of the first layer from being adsorbed (adhering) on the first layer and the surface of the wafer 200. One reason why the adsorption layer acts to suppress the adsorption of by-products on the first layer and the surface of the wafer 200 is that the adsorption of the by-products to the first layer may be suppressed by the modifying agent physically adsorbed on the surface of the wafer 200, or a portion of the modifying agent desorbed from the surface of the wafer 200, being adsorbed on the by-products in preference to the first layer and the surfaces of the wafer 200. By forming the adsorption layer in advance on the bottom surface and the side wall of the inner surface of the concave structure in step A, the adsorption of the by-products on the surface of the wafer 200 and the first layer may be sufficiently suppressed even in the vicinity of the bottom surface of the concave structure where the modifying agent may not reach easily.

The by-products whose adsorption is suppressed are removed from the interior of the process chamber 201 by exhaust. Further, the modifying agent adsorbed on the by-products is removed from the interior of the process chamber 201 by the exhaust in this step or the exhaust in the subsequent step.

After the formation of the first layer on the wafer 200 is completed, the valve 243*b* is closed to stop the supply of the precursor into the process chamber 201.

After the supply of the precursor to the wafer 200 is completed (after being stopped), as shown in FIG. 4, step B2 of exhausting the interior of the process chamber 201, in a state where the supply of the precursor into the process chamber 201 is stopped, to remove a gas or the like remaining in the process chamber 201 from the interior of the process chamber 201 may be performed.

By performing step B2, an atmosphere containing an unreacted precursor remaining in the process chamber 201, a precursor that contributed to the formation of the first layer, by-products whose adsorption is suppressed by the adsorption layer, and the like, may be removed from the interior of the process chamber 201.

Further, by performing step B2, it is possible to desorb the modifying agent contained in the adsorption layer, that is, the modifying agent physically adsorbed on the surface of the wafer 200, from the surface of the wafer 200. As a result, it is possible to suppress the residual of the modifying agent in the film formed on the wafer 200, whereby this film may become a film with a low concentration of impurities caused by the modifying agent.

Further, by performing step B2, it is possible to remove the by-products adhered to the adsorption layer from the surface of the wafer 200, together with the modifying agent contained in the adsorption layer, that is, the modifying agent physically adsorbed on the surface of the wafer 200. As a result, it is possible to suppress the residual of the by-products in the film formed on the wafer 200, whereby this film may become a film with an excellent wafer in-plane film thickness uniformity and an excellent step coverage and with a low concentration of impurities caused by the by-products.

Further, as shown in FIG. 4, in step B2, the valves 243*d* to 243*f* may be opened to allow an inert gas to be supplied into the process chamber 201 via the nozzles 249*a* to 249*c*, respectively. That is, in step B2, the interior of the process chamber 201 may be exhausted while supplying the inert gas to the wafer 200. Further, in step B2, as shown in FIG. 5B, a step of exhausting the interior of the process chamber 201 while supplying an inert gas to the wafer 200 and a step of exhausting the interior of the process chamber 201 in a state where the supply of the inert gas is stopped may be performed. Further, in step B2, a purge cycle including (non-simultaneously performing) a step of exhausting the interior of the process chamber 201 while supplying an inert gas to the wafer 200 and a step of exhausting the interior of the process chamber 201 in a state where the supply of the inert gas is stopped may be performed one or more times.

By performing step B2 with any of the above steps, a portion of the modifying agent physically adsorbed on the surface of the wafer 200 may be removed more efficiently from the surface of the wafer 200, such that the above-described various effects may be obtained more reliably.

Process conditions in supplying the precursor in step B are exemplified as follows:

Precursor supply flow rate (excluding dilution gas): 0.1 to 10 g/min, more specifically 0.5 to 5 g/min Dilution gas supply flow rate: 100 to 100,000 sccm, more specifically 1,000 to 50,000 sccm Precursor supply time: 10 to 600 seconds, more specifically 30 to 300 seconds Inert gas supply flow rate (for each gas supply pipe): 0 to 50,000 sccm, more specifically 5,000 to 15,000 sccm Other conditions may be the same as those in supplying the modifying agent in step A.

The process conditions in step B2 may be the same as those in step A2.

As the precursor, a gas containing a molecule containing a first element and a ligand bonded to the first element may be used. As the first element, a metal element, specifically a transition metal element, more specifically a Group IV element such as zirconium (Zr), hafnium (Hf), and titanium (Ti), may be used. As the ligand bonded to the first element, an organic ligand, specifically a hydrocarbon group including at least one selected from the group of an alkyl group such as a methyl group, an ethyl group, a propyl group, and a butyl group, a cyclopentadienyl group, a cyclohexadienyl group, and a cycloheptatrienyl group, can be used.

As the precursor containing Zr as the first element, for example, a gas containing at least one selected from the group of tetrakisethylmethylaminozirconium ($Zr[N(CH_3)C_2H_5]_4$), tetrakisdiethylaminozirconium ($Zr[N(C_2H_5)_2]_4$), tetrakisdimethylaminozirconium ($Zr[N(CH_3)_2]_4$), $Zr(MMP)_4$, $Zr(O\text{-}tBu)_4$, and trisdimethylaminocyclopentadienylzirconium ($(C_5H_5)Zr[N(CH_3)_2]_3$) may be used. As the precursor, one or more selected from the group of these gases may be used.

Further, as the precursor containing Hf as the first element, for example, a gas containing at least one selected from the group of tetrakisethylmethylaminohafnium ($Hf[N(CH_3)C_2H_5]_4$), tetrakisdiethylaminohafnium ($Hf[N(C_2H_5)_2]_4$), tetrakisdimethylaminohafnium ($Hf[N(CH_3)_2]_4$), $Hf(O\text{-}tBu)_4$, $Hf(MMP)_4$, and trisdimethylaminocyclopentadienylhafnium ($(C_5H_5)Hf[N(CH_3)_2]_3$) may be used. As the precursor, one or more selected from the group of these gases may be used.

Further, as the precursor containing Ti as the first element, for example, a gas containing at least one selected from the group of tetrakisethylmethylaminotitanium ($Ti[N(CH_3)C_2H_5]_4$), tetrakisdiethylaminotitanium ($Ti[N(C_2H_5)_2]_4$), tetrakisdimethylaminotitanium ($Ti[N(CH_3)_2]_4$), $Ti(O\text{-}tBu)_4$, $Ti(MMP)_4$, and trisdimethylaminocyclopentadienyltitanium ($(C_5H_5)Ti[N(CH_3)_2]_3$) may be used. As the precursor, one or more selected from the group of these gases may be used.

[Step C]

After step B is completed, an oxidizing agent is supplied to the wafer 200 in the process chamber 201, that is, to the wafer 200 in which the first layer containing the first element is formed on the surface of the wafer 200.

Specifically, the valve 243*c* is opened to allow the oxidizing agent to flow through the gas supply pipe 232*c*. A flow rate of the oxidizing agent is regulated by the MFC 241*c*, and the oxidizing agent is supplied into the process chamber 201 via the nozzle 249*c* and is exhausted via the exhaust port 231*a*. In this operation, the oxidizing agent is supplied to the wafer 200 (oxidizing agent supply). The oxidizing agent may be supplied in a state where it is diluted with a dilution gas such as an inert gas or another oxygen-containing gas. Further, at this time, the valves 243*d* to 243*f* may be opened to allow an inert gas to be supplied into the process chamber 201 via the nozzles 249*a* to 249*c*, respectively.

By supplying the oxidizing agent to the wafer 200 under conditions to be described later, it is possible to cause the oxidizing agent to react with the first layer to modify (oxidize) the first layer into a second layer containing the first element and oxygen (O).

In addition, by-products may be generated even when the second layer is formed. The by-products may contain ligands desorbed from the first layer by the reaction between the oxidizing agent and the first layer. The by-products may also contain organic ligands (organic substances), like the by-products generated during the formation of the first layer, and re-adsorption (re-adhesion) of the by-products on the second layer and the residual of the by-products in a film formed on the wafer 200 due to the re-adsorption (re-adhesion) of the by-products are not desirable.

In this regard, according to the embodiments of the present disclosure, the adsorption of the by-products generated during the formation of the second layer on at least one selected from the group of the second layer and the surface of the wafer 200 may be suppressed by the adsorption layer formed in advance in step A. It is considered that this is because, as in step B, the adsorption layer formed in advance in step A acts to properly cover a portion of the surface of the wafer 200 or acts to suppress (inhibit) re-adsorption (re-adhesion) of the by-products generated during the formation of the second layer on the second layer.

The by-products whose re-adsorption is suppressed are removed from the interior of the process chamber 201 by exhaust. It may be also considered that a portion of the by-products whose adsorption to the second layer and the surface of the wafer 200 is suppressed may be adsorbed (adhered) on the adsorption layer.

After the formation of the second layer on the wafer 200 is completed, the valve 243*c* is closed to stop the supply of the oxidizing agent into the process chamber 201.

After the supply of the oxidizing agent to the wafer 200 is completed (after being stopped), as shown in FIG. 4, step C2 of exhausting the interior of the process chamber 201, in a state where the supply of the oxidizing agent into the process chamber 201 is stopped, to remove a gas or the like remaining in the process chamber 201 from the interior of the process chamber 201 may be performed.

By performing step C2, an atmosphere containing an unreacted oxidizing agent remaining in the process chamber 201, an oxidizing agent that contributed to the formation of the second layer, by-products whose adsorption is suppressed by the adsorption layer, and the like, may be removed from the interior of the process chamber 201.

Further, by performing step C2, it is possible to desorb the modifying agent contained in the adsorption layer, that is, the modifying agent physically adsorbed on the surface of the wafer 200, from the surface of the wafer 200. As a result, it is possible to suppress the residual of the modifying agent in the film formed on the wafer 200, whereby this film may become a film with a low concentration of impurities caused by the modifying agent.

Further, by performing step C2, it is possible to remove the by-products adhered to the adsorption layer from the surface of the wafer 200, together with the modifying agent contained in the adsorption layer, that is, the modifying agent physically adsorbed on the surface of the wafer 200. As a result, it is possible to suppress the residual of the by-products in the film formed on the wafer 200, whereby this film may become a film with an excellent wafer in-plane film thickness uniformity and an excellent step coverage and with a low concentration of impurities caused by the by-products.

Figures 5C, 5D:
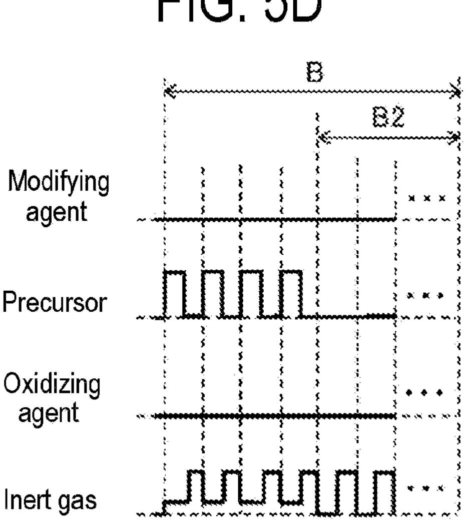
FIG. 5C is a diagram showing an oxidizing agent supply sequence in embodiments of the present disclosure.
FIG. 5D is a diagram showing a precursor supply sequence in embodiments of the present disclosure.

Further, as shown in FIG. 4, in step C2, the valves 243*d* to 243*f* may be opened to allow an inert gas to be supplied into the process chamber 201 via the nozzles 249*a* to 249*c*, respectively. That is, in step C2, the interior of the process chamber 201 may be exhausted while supplying the inert gas to the wafer 200. Further, specifically, in step C2, as shown in FIG. 5C, a step of exhausting the interior of the process chamber 201 while supplying an inert gas to the wafer 200 and a step of exhausting the interior of the process chamber 201 in a state where the supply of the inert gas is stopped may be performed. Further, specifically, in step C2, a purge cycle including (non-simultaneously performing) a step of exhausting the interior of the process chamber 201 while supplying an inert gas to the wafer 200 and a step of exhausting the interior of the process chamber 201 in a state where the supply of the inert gas is stopped may be performed one or more times.

By performing step C2 with any of the above steps, a portion of the modifying agent physically adsorbed on the surface of the wafer 200 may be removed more efficiently from the surface of the wafer 200, such that the above-described various effects may be obtained more reliably.

Process conditions in supplying the oxidizing agent in step C are exemplified as follows:

Oxidizing agent supply flow rate: 100 to 100,000 sccm, more specifically 1,000 to 10,000 sccm Oxidizing agent supply time: 10 to 600 seconds, more specifically 30 to 300 seconds Inert gas supply flow rate (for each gas supply pipe): 0 to 50,000 sccm, more specifically 5,000 to 15,000 sccm Other conditions may be the same as those in supplying the modifying agent in step A.

The process conditions in step C2 may be the same as those in step A2.

As the oxidizing agent, for example, an oxygen (O)- and hydrogen (H)-containing gas may be used. As the O- and H-containing gas, for example, water vapor ($H_2O$ gas), a hydrogen peroxide ($H_2O_2$) gas, a hydrogen ($H_2$) gas+oxygen ($O_2$) gas, a $H_2$ gas+ozone ($O_3$) gas, or the like may be used. One or more selected from the group of these gases may be used as the O- and H-containing gas.

In the present disclosure, description of two gases such as a "H2 gas+O2 gas" together means a mixed gas of $H_2$ gas and $O_2$ gas. When supplying the mixed gas, the two gases may be mixed (pre-mixed) in a supply pipe and then supplied into the process chamber 201, or the two gases may be supplied separately from different supply pipes into the process chamber 201 and then mixed (post-mixed) in the process chamber 201.

[Performing Predetermined Number of Times]

By performing a cycle a predetermined number of times (n time, where n is an integer of 1 or more), the cycle including non-simultaneously, that is, without synchronization, performing the above-described steps A to C, it is possible to form a film containing the first element and O (an oxide film containing the first element) on the surface of the wafer 200 including the inner surface of the concave structure formed on the wafer 200, that is, on the surface of the wafer 200. The above-described cycle may be performed one or more times. That is, a thickness of the second layer formed per cycle may be set to be smaller than a desired film thickness, and the above-described cycle may be performed one or more times until the thickness of an oxide film formed by stacking second layers reaches the desired film thickness.

(After-Purge and Returning to Atmospheric Pressure)

After the formation of the film on the wafer 200 is completed, an inert gas acting as a purge gas is supplied into the process chamber 201 from each of the nozzles 249*a* to 249*c* and is exhausted via the exhaust port 231*a*. Thus, the interior of the process chamber 201 is purged and a gas or reaction by-products, or the like remaining in the process chamber 201 is removed from the interior of the process chamber 201 (after-purge). Thereafter, the internal atmosphere of the process chamber 201 is substituted with an inert gas (inert gas substitution) and the internal pressure of the process chamber 201 is returned to the atmospheric pressure (returning to atmospheric pressure).

(Boat Unloading and Wafer Discharging)

Subsequently, the seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219*s* is moved and the lower end opening of the manifold 209 is sealed by the shutter 219*s* via the O-ring 220*c* (shutter close). The processed wafers 200 are unloaded from the reaction tube 203 and are then discharged from the boat 217 (wafer discharging).

(3) Effects of the Embodiments

According to the embodiments of the present disclosure, one or more effects set forth below may be achieved.

(a) When the cycle including steps A to C is performed a predetermined number of times, it is possible to improve the film quality of the film formed on the wafer 200 by suppressing the adsorption of the by-products, which are generated during the formation of the first layer, on at least one selected from the group of the first layer and the surface of the wafer 200 by the adsorption layer. For example, it is possible to improve the wafer in-plane film thickness uniformity and the step coverage of the film formed on the wafer 200. Further, for example, the film formed on the wafer 200 may become a film with a low concentration of impurities caused by the by-products generated during the formation of the first layer. As an example, the concentration of impurities contained in the film formed on the wafer 200 is lower than the concentration of impurities contained in a film formed on the wafer 200 by performing a cycle the same predetermined number of cycles, the cycle including steps B and C without step A.

(b) When the cycle including steps A to C is performed a predetermined number of times, it is possible to further improve the film quality of the film formed on the wafer 200 by suppressing the adsorption of the by-products, which are generated during the formation of the second layer, on at least one selected from the group of the second layer and the surface of the wafer 200 by the adsorption layer. For example, it is possible to further improve the wafer in-plane film thickness uniformity and the step coverage of the film formed on the wafer 200. Further, for example, the film formed on the wafer 200 may become a film with a lower concentration of impurities caused by the by-products generated during the formation of the second layer.

(c) Since the modifying agent contained in the adsorption layer is physically adsorbed on the surface of the wafer 200, it may be easily desorbed from the surface of the wafer 200 in the process of performing the cycle including steps A to C. As a result, it is possible to improve a productivity of film-forming process by regulating a formation rate of the film formed on the wafer 200 to a desired value. Further, it is possible to improve the quality of the film by suppressing the residual of the modifying agent in the film formed on the wafer 200.

For example, in step A, after supplying the modifying agent to the wafer 200, by performing step A2 of exhausting the interior of the process chamber 201, it is possible to remove a portion of the modifying agents contained in the adsorption layer from the surface of the wafer 200. This makes it possible to regulate the density (thickness) of the adsorption layer formed on the wafer 200 to a desired density (thickness). As a result, it is possible to progress the formation of the film on the wafer 200 at a desired rate. Further, it is possible to suppress the residual of the modifying agent in the film formed on the wafer 200, whereby this film may become a film with a low concentration of impurities caused by the modifying agent.

Further, for example, in step B, by performing step B2 of supplying the precursor to the wafer 200 and then exhausting the interior of the process chamber 201, the modifying agent contained in the adsorption layer may be desorbed from the surface of the wafer 200, whereby the residual of the modifying agent in the film formed on the wafer 200 is suppressed, which makes this film become a film with a low concentration of impurities caused by the modifying agent. Further, by removing the by-products adhered to the adsorption layer from the surface of the wafer 200, together with the modifying agent contained in the adsorption layer, it is possible to suppress the residual of the by-products in the film formed on the wafer 200. As a result, this film may become a film with an excellent wafer in-plane uniformity and an excellent step coverage and with a low concentration of impurities caused by the by-products generated during the formation of the first layer.

Further, for example, in step C, by performing step C2 of supplying the oxidizing agent to the wafer 200 and then exhausting the interior of the process chamber 201, the modifying agent contained in the adsorption layer may be desorbed from the surface of the wafer 200, whereby the residual of the modifying agent in the film formed on the wafer 200 is suppressed, whereby this film may become a film with a low concentration of impurities caused by the modifying agent. Further, by removing the by-products adhered to the adsorption layer from the surface of the wafer 200, together with the modifying agent contained in the adsorption layer, it is possible to suppress the residual of the by-products in the film formed on the wafer 200. As a result, this film may become a film with an excellent wafer in-plane uniformity and an excellent step coverage and with a low concentration of impurities caused by the by-products generated during the formation of the second layer.

(d) In step A, by forming a discontinuous adsorption layer (adsorption layer with a thickness of less than one molecular layer) on the wafer 200, that is, by exposing a portion of the adsorption sites (OH groups) existing on the surface of the wafer 200, in step B, it is possible to bond the first element contained in the precursor to the adsorption sites existing on the surface of the wafer 200. As a result, it is possible to progress the formation of the film on the wafer 200 at a desired rate.

(e) The above-described effects are particularly useful when a concave structure is formed on the surface of the wafer 200 and a film is to be formed on the inner surface of the concave structure.

This is because when a film is to be formed on the inner surface of the concave structure formed on the surface of the wafer 200, the by-products generated in the concave structure pass through an opening of the concave structure when being discharged from the interior of the concave structure, and therefore, an exposure amount of the by-product tends to be larger in the vicinity of the opening of the concave structure than in the vicinity of the bottom of the concave structure. Therefore, the by-products are likely to be adsorbed in the vicinity of the opening of the concave structure. As a result, a film formed in the vicinity of the opening of the concave structure is more likely to increase in film thickness and become a film with a high concentration of impurities caused by the by-products, as compared with a film formed in the vicinity of the bottom of the concave structure. In particular, this will be remarkable when an aspect ratio of the concave structure is 10 or more.

According to the embodiments of the present disclosure, as described above, since the adsorption of the by-products, which are generated during the formation of the first layer and the second layer, on at least one selected from the group of the first layer, the second layer, and the surface of the wafer 200 may be suppressed by the adsorption layer, it is possible to improve the step coverage of the film formed on the inner surface of the concave structure formed on the wafer 200. Further, in step A, when the adsorption layer is formed on at least the bottom surface and the side wall of the inner surface of the concave structure, that is, when it is formed on the opening and the entire inner surface of the concave structure, the adsorption of the by-products may be suppressed at the openings of the concave structure and the bottom surface and the side wall of the concave structure. As a result, it is possible to further improve the step coverage of the film formed on the wafer 200 and to form a film with a low concentration of impurities caused by the by-products on the entire inner surface of the concave structure.

(f) The above-described effects may be similarly obtained even when a predetermined substance (gaseous substance or liquefied substance) is arbitrarily selected and used among the above-described modifying agent group, precursor group, oxidizing agent group, and inert gas group.

Other Embodiments of the Present Disclosure

The embodiments of the present disclosure have been specifically described above. However, the present disclosure is not limited to the above-described embodiments, and various changes may be made without departing from the gist thereof.

For example, as shown in FIG. 5D and the processing sequence described below, in step B, a precursor supply cycle including a step of supplying a precursor to the wafer 200 and a step of exhausting the interior of the process chamber 201 with the supply of the precursor stopped may be performed one or more times (m times, where m is an integer of 2 or more). Process conditions in each of these steps may be the same as the precursor supply described in the above-described embodiments and the process conditions in step B2.

[Modifying agent→(Precursor→Exhaust)×*m* Oxidizing agent]×*n*

In a case where continuous supply time of the precursor becomes long, a thermal decomposition of the precursor progresses, and an amount of by-products generated by the thermal decomposition may increase. The continuous supply time of the precursors may be shortened to suppress the increase in the amount of by-products due to such thermal decomposition. In the embodiments of the present disclosure, by supplying the precursor in a time-division manner to shorten the continuous supply time, the first layer may be formed while suppressing the generation (increase) of by-products.

Further, in this case, the modifying agent contained in the adsorption layer may be desorbed from the surface of the wafer 200 each time the precursor supply cycle is performed, whereby it possible to further suppress the residual of the modifying agent in the film. Further, the by-products adhered to the adsorption layer may be removed from the surface of the wafer 200 together with the modifying agent contained in the adsorption layer every time the precursor supply cycle is performed, whereby it possible to further suppress the residual of the by-products in the film. As a result, the film formed on the wafer 200 may become a film with an excellent wafer in-plane film thickness uniformity and step coverage and with a lower concentration of impurities caused by the modifying agents and the by-products.

Further, as shown in FIG. 5D, in the exhaust step in the precursor supply cycle of the embodiments of the present disclosure, the valves 243*d* to 243*f* may be opened to allow an inert gas as a purge gas to be supplied into the process chamber 201 via the nozzles 249*a* to 249*c*, respectively.

Further, for example, as in FIG. 5E and the processing sequence described below, in the above-described precursor supply cycle, a step of supplying the modifying agent to the wafer 200 may be further performed.

[Modifying agent→(Precursor→Exhaust→Modifying agent→Exhaust)×*m*→Oxidizing agent]×*n*, or

[Modifying agent→(Precursor→Exhaust→Modifying agent)×*m*→Oxidizing agent]×*n*

When the precursor supply cycle is performed as described above, the modifying agent contained in the adsorption layer is desorbed from the surface of the wafer 200 each time the precursor supply cycle is performed. As a result, the modifying agent constituting the adsorption layer may be insufficient. In such a case, it is possible to supplement the insufficient modifying agent by supplying the modifying agent even in the precursor supply cycle. As a result, the adsorption of the by-products, which are generated every time the precursor supply cycle is performed, on at least one selected from the group of the first layer and the surface of the wafer 200 may be more reliably suppressed by the adsorption layer, whereby it possible to further improve the film quality of the film formed on the wafer 200.

Figures 5E, 5F:
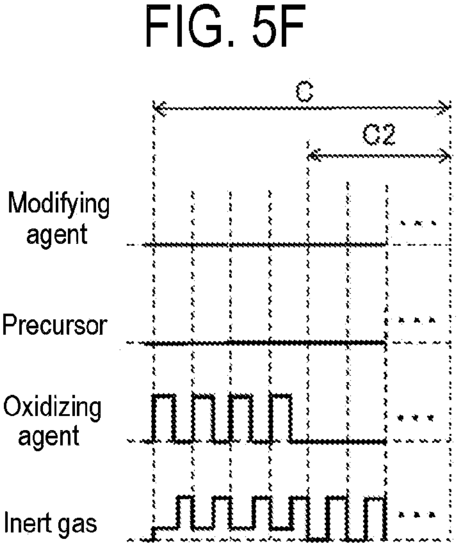
FIG. 5E is a diagram showing a precursor supply sequence in embodiments of the present disclosure.
FIG. 5F is a diagram showing an oxidizing agent supply sequence in embodiments of the present disclosure.

Further, as shown in FIG. 5E, in the exhaust step in the precursor supply cycle of the embodiments of the present disclosure, the valves 243*d* to 243*f* may be opened to allow an inert gas as a purge gas to be supplied into the process chamber 201 via the nozzles 249*a* to 249*c*, respectively. Further, in the precursor supply cycle of the embodiments of the present disclosure, the step of exhausting the modifying agent after the step of supplying the modifying agent may not be performed.

Further, for example, as in FIG. 5F and the processing sequence shown below, in step C, an oxidizing agent supply cycle including a step of supplying the oxidizing agent to the wafer 200 and a step of exhausting the interior of the process chamber 201 with the supply of the oxidizing agent stopped may be performed one or more times (m times, where m is an integer of 2 or more). The process conditions in each of these steps may be the same as the oxidizing agent supply described in the above-described embodiments and the process conditions in step C2.

[Modifying agent→Precursor→(Oxidizing agent→Exhaust)×*m*]×*n*

In this case, the modifying agent contained in the adsorption layer may be desorbed from the surface of the wafer 200 each time the oxidizing agent supply cycle is performed, whereby it possible to further suppress the residual of the modifying agent in the film. Further, the by-products adhered to the adsorption layer may be removed from the surface of the wafer 200, together with the modifying agent contained in the adsorption layer, each time the oxidizing agent supply cycle is performed, whereby it possible to further suppress the residual of the by-products in the film. As a result, the film formed on the wafer 200 may become a film with an excellent wafer in-plane film thickness uniformity and an excellent step coverage and with a lower concentration of impurities caused by the modifying agent and the by-products.

Further, as shown in FIG. 5F, in the exhaust step in the oxidizing agent supply cycle of the embodiments of the present embodiment, the valves 243*d* to 243*f* may be opened to allow an inert gas as a purge gas to be supplied into the process chamber 201 via the nozzles 249*a* to 249*c*, respectively.

Recipes used in each process may be provided individually according to the processing contents and may be stored in the memory 121*c* via a telecommunication line or the external memory 123. Moreover, at the beginning of each process, the CPU 121*a* may properly select an appropriate recipe from the recipes stored in the memory 121*c* according to the processing contents. Thus, it is possible for a single substrate processing apparatus to form films of various kinds, composition ratios, qualities, and thicknesses with enhanced reproducibility. Further, it is possible to reduce a manipulator's burden and to quickly start each process while avoiding an operation error.

The recipes mentioned above are not limited to newly-provided ones but may be provided, for example, by modifying existing recipes that are already installed in the substrate processing apparatus. In the case where the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

An example in which a film is formed by using a batch-type substrate processing apparatus capable of processing a plurality of substrates at a time is described in the above-described embodiments. The present disclosure is not limited to the above-described embodiments, but may be suitably applied, for example, to a case where a film is formed by using a single-wafer type substrate processing apparatus capable of processing a single substrate or several substrates at a time. In addition, an example in which a film is formed by using a substrate processing apparatus provided with a hot-wall-type process furnace is described in the above-described embodiments. The present disclosure is not limited to the above-described embodiments, but may be suitably applied to a case where a film is formed by using a substrate processing apparatus provided with a cold-wall-type process furnace.

Even in the case of using these substrate processing apparatuses, each process may be performed according to the same processing procedures and process conditions as those in the above-described embodiments, and the same effects as those of the above-described embodiments are achieved.

The above-described embodiments may be used in proper combination. Processing procedures and process conditions used in this case may be the same as, for example, the processing procedures and process conditions in the above-described embodiments.

EXAMPLES

Example 1

As Example 1, a hafnium oxide film (HfO film) is formed on a pattern wafer with a concave structure formed on the surface of the wafer by the processing sequence shown in FIG. 4 by using the above-described substrate processing apparatus. As a modifying agent, a precursor, an oxidizing agent, and an inert gas, predetermined substances are selected from the substance group shown in the above-described embodiments. Process conditions when performing each step are set to predetermined conditions within a range of the processing conditions in each step shown in the above-described embodiments.

As Comparative Example 1, a HfO film is formed on a pattern wafer with a concave structure formed on the surface of the wafer by a processing sequence in which step A is not performed among the processing sequence shown in FIG. 4 by using the above-described substrate processing apparatus. As a precursor, an oxidizing agent, and an inert gas, the same substances as those used in Example 1 are selected. Process conditions when performing each step are set to predetermined conditions within a range of the processing conditions in each step in Example 1.

Then, for Example 1 and Comparative Example 1, film thicknesses of the HfO film formed in the concave structure are measured. The film thicknesses are measured at two locations in the concave structure, that is, in the vicinity of an opening (TOP) and in the vicinity of the bottom (BTM). Then, a cycle rate at each measurement point, that is, a thickness (Å/cycle) of the HfO film formed per cycle, is calculated. Further, as an index indicating quality of the step coverage, a value (step coverage) obtained by [cycle rate in BTM/cycle rate in TOP]×100(%) is calculated.

Figure 6:
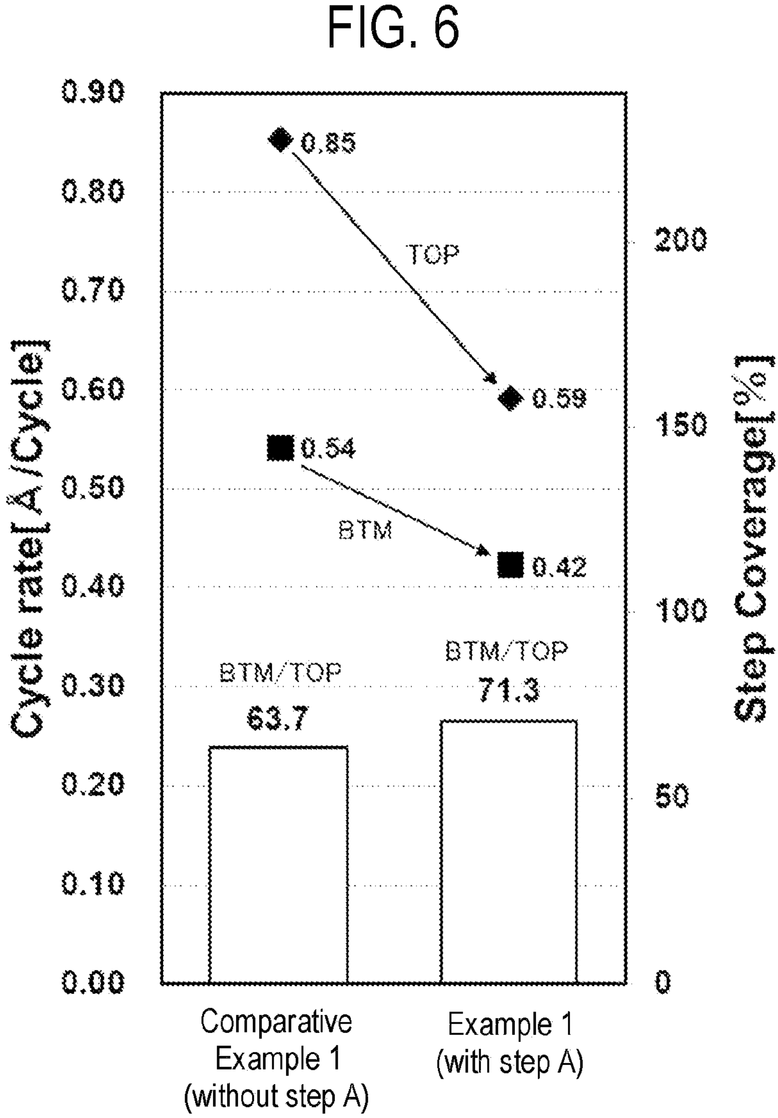
FIG. 6 is a diagram showing Example 1 and Comparative Example 1.

The results are shown in FIG. 6. In FIG. 6, a left vertical axis represents the cycle rate (A/cycle), and a right vertical axis represents the step coverage (%). In FIG. 6, a horizontal axis represents Comparative Example 1 and Example 1 in order. In the figure, ♦ mark indicates the cycle rate in TOP, ■ mark indicates the cycle rate in BTM, and a pillar graph indicates the step coverage (%).

As shown in FIG. 6, it may be seen that the step coverage (%) is improved in Example 1 as a result of appropriately suppressing the cycle rate in the TOP portion, as compared with Comparative Example 1. It is considered that this is because, as described in the above-described embodiments, introduction of by-products into the HfO film may be suppressed by performing step A at a predetermined timing to form the adsorption layer.

Example 2

As Example 2, a HfO film is formed on a pattern wafer with a concave structure formed on the surface of the wafer by the processing sequence shown in FIG. 4 by using the above-described substrate processing apparatus. As a modifying agent, a precursor, an oxidizing agent, and an inert gas, predetermined substances are selected from the substance groups shown in the above-described embodiments. Process conditions when performing each step are set to predetermined conditions within a range of the processing conditions in each step described in the above-described embodiments.

As Comparative Example 2, a HfO film is formed on a pattern wafer with a concave structure formed on the surface of the wafer by a processing sequence in which step A is not performed among the processing sequence shown in FIG. 4 by using the above-described substrate processing apparatus. As a precursor, an oxidizing agent, and an inert gas, the same substances as those used in Example 1 are selected. Process conditions when performing each step are set to predetermined conditions within a range of the processing conditions in each step in Example 1.

Figure 7:
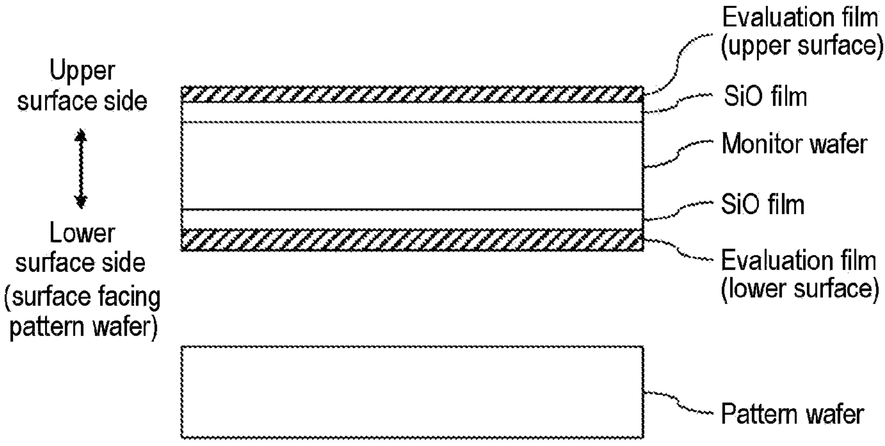
FIG. 7 is a schematic view showing an arrangement of a wafer in a process chamber when providing Example 2 and Comparative Example 2.

In both Example 2 and Comparative Example 2, a film-forming process is performed with a monitor wafer installed at a position facing the surface (processed surface) of the pattern wafer, as shown in FIG. 7. As the monitor wafer, a silicon wafer in which both an upper surface (a surface that does not face the surface of the pattern wafer) and a lower surface (a surface that faces the surface of the pattern wafer) are configured to be flat (a concave structure is not formed) and a SiO film as a base is formed on each of the upper surface and the lower surface is used.

Figure 8A:
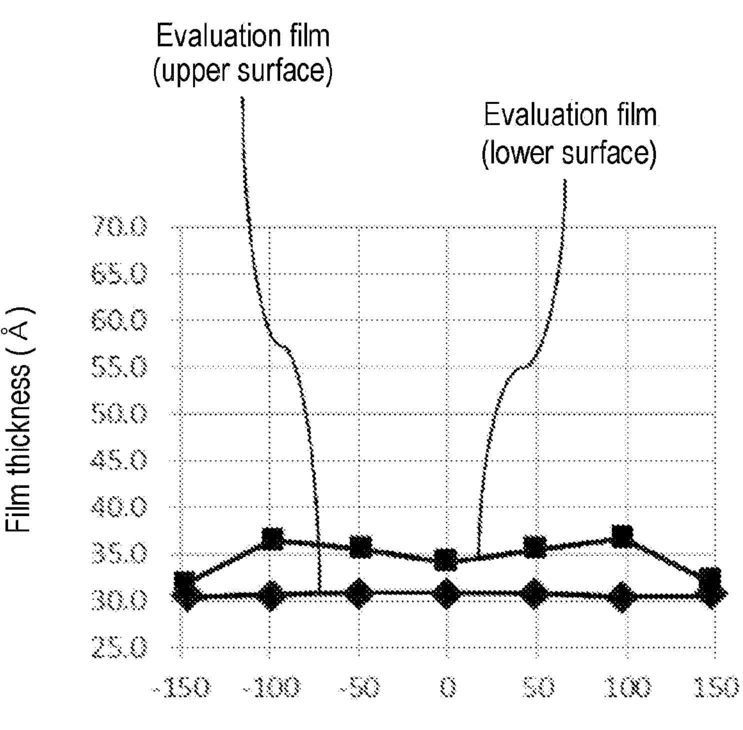
FIG. 8A is a diagram showing Example 2.
Figure 8B:
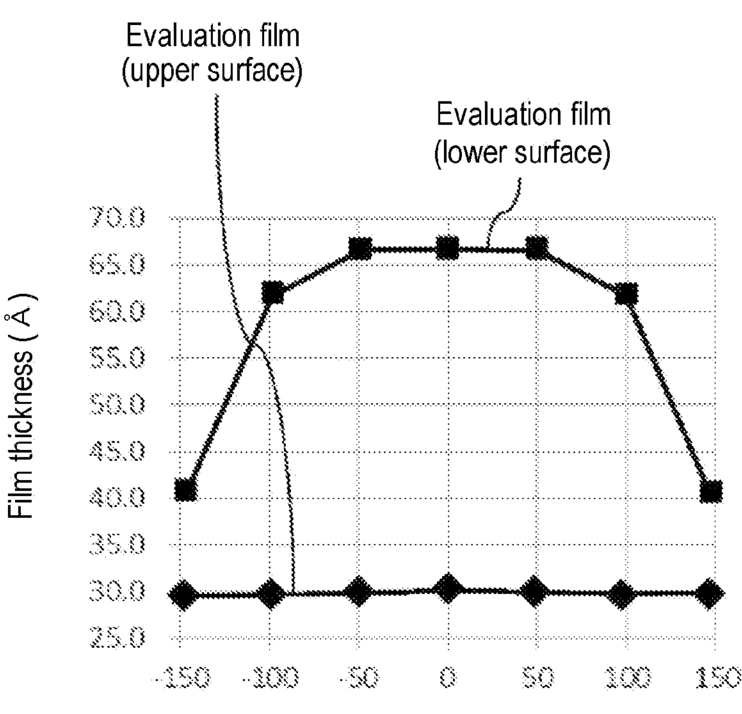
FIG. 8B is a diagram showing Comparative Example 2.

Then, in Example 2 and Comparative Example 2, a thickness of the HfO film (hereinafter, referred to as an evaluation film) formed on each of the upper surface and the lower surface of the monitor wafer is measured. The results are shown in FIGS. 8A and 8B. In FIG. 8A, a vertical axis represents a thickness (Å) of the evaluation film in Example 2, and a horizontal axis represents a distance (mm) of a measurement point from a center of the wafer. In FIG. 8B, a vertical axis represents a thickness (Å) of the evaluation film in Comparative Example 2, and a horizontal axis represents a distance (mm) of a measurement point from the center of the wafer.

As shown in these figures, it may be seen that the thickness of the evaluation film formed on the lower surface of the monitor wafer is thinner in Example 2 than in Comparative Example 2. This means that the amount of by-products generated in the film-forming process is smaller in Example 2 than in Comparative Example 2. It is considered that the reason why the amount of by-products generated in Example 2 is smaller is that, as described above, (1) the adsorption layer formed in step A properly covers the surface of the monitor wafer such that the by-products are not adsorbed on the surface of the monitor wafer, and the adsorption layer acts to suppress the adsorption of by-products on the first layer and the second layer such that the adsorption of by-products on the surface of the monitor wafer and the first layer and the second layer formed on the surface of the monitor wafer is suppressed, (2) the adsorption layer formed in step A reduces the amount of adsorption sites exposed on the surface of the wafer 200, whereby, in step B, the state of reaction between the precursor and the surface of the wafer 200 is appropriately controlled, and as a result, the amount of organic ligands desorbed from Hf is reduced, and so on.

According to the present disclosure in some embodiments, it is possible to improve the quality of a film formed on a substrate.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising forming a film containing a first element and oxygen on the substrate by performing a cycle a predetermined number of times, the cycle including:

(a) supplying a modifying agent to the substrate to form an adsorption layer containing the modifying agent physically adsorbed on a portion of a surface of the substrate;

(b) supplying a precursor including a molecule containing the first element and ligand bonded to the first element to the substrate and causing the precursor to react with another portion of the surface of the substrate to form a first layer containing the first element while a first by-product containing the ligand desorbed from the first element in the precursor, which is generated during the formation of the first layer, is adsorbed on the adsorption layer; and (c) supplying an oxidizing agent to the substrate and causing the oxidizing agent to react with the first layer to modify the first layer into a second layer containing the first element and oxygen.

2. The method of claim 1, wherein the first by-product contains the ligand desorbed from the first element in the precursor by a reaction between the precursor and an adsorption site on the surface of the substrate.

3. The method of claim 1, wherein adsorption of a second by-product, which contains the ligand desorbed from the first layer during formation of the second layer, on at least one selected from the group of the second layer and the surface of the substrate is suppressed by the adsorption layer.

4. The method of claim 3, wherein the adsorption layer suppresses adsorption of the second by-product on at least one selected from the group of the second layer and the surface of the substrate by adsorbing the second by-product on the adsorption layer in (c).

5. The method of claim 3, wherein (c) further includes (c2) exhausting a space in which the substrate is placed after supplying the oxidizing agent to the substrate, and wherein in (c2), the second by-product that is adsorbed on the adsorption layer is removed from the surface of the substrate together with the modifying agent contained in the adsorption layer.

6. The method of claim 1, wherein the adsorption layer contains the modifying agent adsorbed to discontinuously cover the surface of the substrate.

7. The method of claim 1, wherein (a) further includes (a2) exhausting a space in which the substrate is placed after supplying the modifying agent to the substrate.

8. The method of claim 7, wherein in (a2), a portion of the modifying agent contained in the adsorption layer is removed from the surface of the substrate until a thickness of the adsorption layer decreases to a desired thickness so as to regulate a formation rate of the film to be a desired value in each cycle.

9. The method of claim 7, wherein in (a2), exhaust of the space in which the substrate is placed is continued until a thickness of the adsorption layer reaches a desired thickness.

10. The method of claim 7, wherein in (a2), an exhaust condition of the space in which the substrate is placed is set such that a formation rate of the film becomes a desired value.

11. The method of claim 1, wherein a concave structure is formed on the substrate, and the film is formed on an inner surface of the concave structure.

12. The method of claim 11, wherein in (a), the adsorption layer is formed on at least a bottom surface and a side wall of the inner surface of the concave structure.

13. The method of claim 1, wherein in (b), a precursor supply cycle is performed a plurality of times, the precursor supply cycle including:

supplying the precursor to the substrate; and exhausting a space in which the substrate is placed with the supply of the precursor stopped.

14. The method of claim 1, wherein the modifying agent includes an organic compound.

15. The method of claim 14, wherein the modifying agent includes at least one selected from the group of an ether compound, a ketone compound, an amine compound, and an organic hydrazine compound.

16. The method of claim 1, wherein the ligand is an organic ligand.

17. A method of manufacturing a semiconductor device, comprising the method of claim 1.

18. The method of claim 1, wherein the adsorption layer suppresses adsorption of the first by-product on at least one selected from the group of the first layer and the surface of the substrate by adsorbing the first by-product on the adsorption layer in (b).

19. The method of claim 1, wherein (b) further includes (b2) exhausting a space in which the substrate is placed after supplying the precursor to the substrate, and wherein in (b2), the first by-product that is adsorbed on the adsorption layer is removed from the surface of the substrate together with the modifying agent contained in the adsorption layer.

* * * * *